April 26, 1955 D. BLITZ 2,707,272

MOUNTING DEVICE FOR ELECTRIC COMPONENTS

Filed May 21, 1954

INVENTOR.
DANIEL BLITZ

BY [signature]

Attorney

United States Patent Office 2,707,272
Patented Apr. 26, 1955

2,707,272

MOUNTING DEVICE FOR ELECTRIC COMPONENTS

Daniel Blitz, Boston, Mass., assignor to Sanders Associates, Incorporated, Nashua, N. H., a corporation of Massachusetts Application May 21, 1954, Serial No. 431,539

2 Claims. (Cl. 339—17)

This invention relates to electronic apparatus and to improvements in its construction and methods of manufacture. The invention is particularly useful in connection with mechanization or automatic production in manufacturing systems of electronic apparatus.

In the copending application of R. C. Sanders, Jr., Serial No. 397,226, filed December 9, 1953, there is described an invention relating to electronic apparatus which provides an improved component which is now well known in electronic industry as "Reliaplate." The present invention is directed to improvements in the construction and in the method of manufacture of components of this character.

It is therefor an object of the present invention to provide an improved composite electronic component and an improved method of manufacturing the same which is useful in electronic apparatus of the character described.

A further object of the invention is to provide an improved composite electronic component and an improved method of manufacturing same which is free of certain constructional and electrical limitations inherent in the construction of similar components of the prior art and previously known methods of manufacture.

Other and further objects of the invention will be apparent from the description of preferred embodiments thereof, taken in connection with the following description and accompanying drawings.

In accordance with the invention there is provided a composite unit embodying electrical components which comprises a supporting base having a plurality of orifices formed therein in predetermined positions. Conductive passage-ways are formed on one or both surfaces of the supporting base ending adjacent the orifices. A wafer element having a flat body portion is provided with a plurality of tabs extending from shoulders formed on the edges of the body portion, in positions corresponding to and projecting into the orifices of the base plate. The tabs have a transverse dimension less than the diameters of the orifices and metallic connecting means, such as solder, is extended through the orifices in the space around the tabs so as to connect the conductive passage-way on one side of the base plate with the opposite side of the plate.

In accordance with the method of manufacture of the present invention, the wafer element is disposed on the base plate with its tabs extending through the base plate orifices and metal in a molten state is forced through the orifices in the spaces between the tabs and the orifice edges, and then permitted to congeal into an electrical connection member between the opposite surfaces of the plate and, when desired, between one surface of the plate and a conductive passage-way on the wafer element.

When using the structure comprising wafer elements mounted on base plates, such as are commonly known as "Reliaplates," it is frequently desirable to have the connecting tabs on the wafer elements make electrical contact with circuitry on one or both of the surfaces of the base plate. Normally, this would require soldering operations on the sides of the base plate which, in the presence of the wafer element, presents an awkward and difficult operation. In accordance with the method of manufacture of the present invention, the wafer element is mounted in the normal manner and the unit is then solder dipped with the solder pressure increased by depressing the unit deep into the molten metal of the solder boat, or container, in which the unit is dipped and which is suitably shaped so as to prevent the overflow of the solder. For example, it may be pressed down to a depth of approximately 3/16 of an inch. The tabs on the wafer element in the orifices in the base plate are of such dimensions and configurations, for example a rectangular tab and a circular orifice, that a gap is provided between the inner edge of the orifice and the tab.

Thus, the present invention provides a method in which the wafer element is assembled in the base plate in the usual manner and the unit is then dipped into the molten metal solder bath sufficiently below the surface so that the molten metal is forced under pressure to flow through the gap or space between the tab and base plate orifice. Upon allowing the molten metal to congeal, this forms a connection around the tab extending through the orifices and connecting the opposite sides of the base plate. It will thus be seen that there is in this manner provided a reliable electrical connection means through the plate for connecting conductive paths on the opposite sides of the plate with each other and/or with a conductive path on the wafer element. These several connections are simultaneously made with a single solder dip operation. As it is also frequently desirable to provide a reliable electrical connection between metal on the tab or wafer element and the conductive paths on the base plate, the present invention provides an extremely inexpensive and speedy method of producing these connections.

When the wafer element is secured to the base plate in accordance with the structures of the prior art, the contact between the surface of the base plate and the adjacent edge of the wafer element provides a ready opportunity for flux, moisture, dirt and the like to be trapped. This tends to cause electrical leakage between the adjacent tabs on the wafer element. In order to obviate this possibility, in accordance with the present invention, the wafer elements are so designed as to have the edge of the wafer element raised out of contact with the base plate upon assembly.

The invention will be described in more detail in connection with preferred embodiments thereof.

Figure 1:
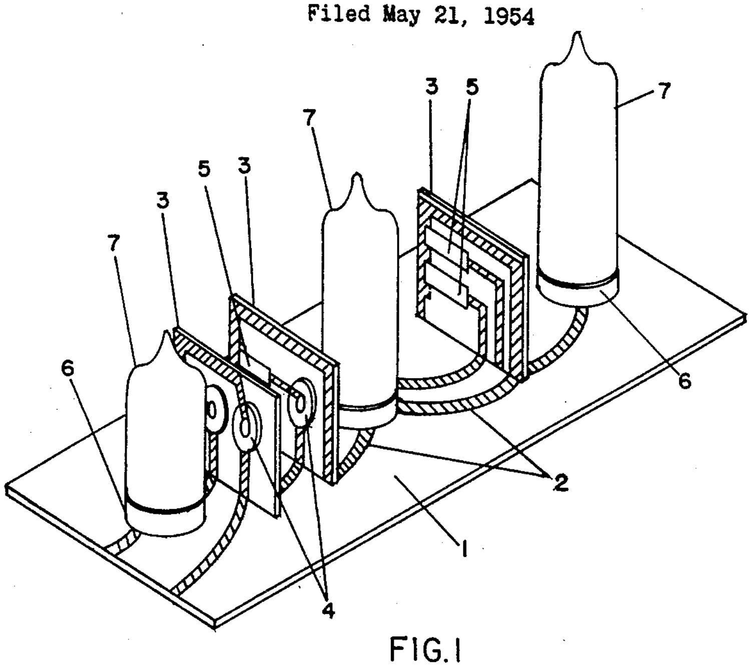
Fig. 1 is an isometric view of an electronic assembly embodying the present invention.

The composite unit of Fig. 1 comprises a base plate 1 which is formed of a nonconductive material such as XXXP-Phenolic plastic and has conductive paths 2 (shown cross-hatched) of a material such as copper, disposed on its opposite surfaces and providing connection conductive paths or circuitry for the various electrical components of the structure. Wafer elements (Reliaplates) 3 are secured to the base plate, as hereinafter described in detail, with reference to the embodiments shown in Figs. 4, 5 and 6. The wafer elements carry capacitors 4 and resistors 5, as shown. The base plate also carries vacuum tube sockets 6 and secured in the sockets are amplifier tubes 7.

Figures 2, 3:
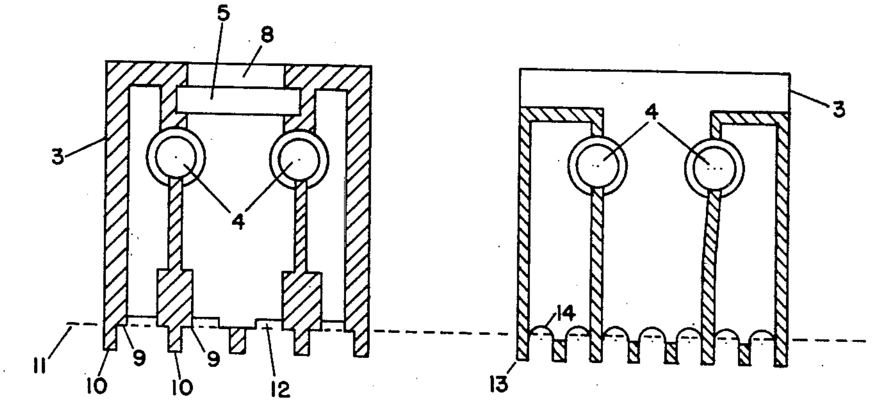
Fig. 2 is an elevated side view of an embodiment of the present invention.
Fig. 3 is an elevated side view of another embodiment of the present invention.

As shown in Fig. 2 wafer elements 3 comprise a flat member, preferably formed of plastic, having a body portion 8 provided with a plurality of shoulders 9 extending from one of its edges and having tabs 10 extending therefrom. The tabs 10 are preferably rectangular in cross-section, for example .03 of an inch by .06 of an inch.

The shoulders 9 of the wafer element limit the depth to which the tabs 10 may be inserted into the base plate orifices (level of the base plate is indicated by the dotted line 11) and provide air gaps 12 between the edge of the wafer element and the base plate.

In Fig. 3 there is shown a modified form of the wafer element wherein the tabs 13 are interconnected by way of curved or arced portions 14 formed in the body of the wafer element, as shown. This in effect provides the limiting shoulders, preventing the insertion of the wafer members into the base plate beyond the desired limit. This construction permits fabrication by simpler tooling and provides, as well, a wafer of increased strength.

Figure 4:
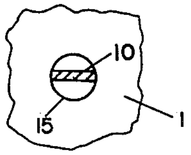
Fig. 4 is a fragmentary view, partly in section, further illustrating a method of assembly embodying the present invention.
Figure 5:
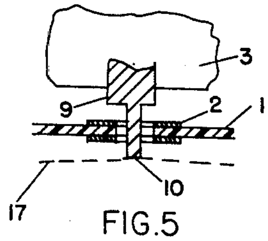
Fig. 5 is a fragmentary side view, partly in section, illustrating another method of assembly embodying the present invention.
Figure 6:
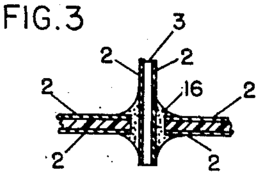
Fig. 6 is a fragmentary side view, partly in section, illustrating still further the assembly of the present invention.

In Fig. 4 the fragmentary view of the base plate 1 illustrates the cross-sectional area of the orifice 15 occupied by a tab extension 10. In Fig. 5 plate 1 is shown in cross-section and illustrates the position of the tab 10 before the assembly is inserted in the solder pot (the level of the solder is indicated at 17). The shoulders 9 contact the conductive paths 2 as shown. In Fig. 6 the cross-section of a completed solder joint is illustrated. When the base plate is depressed into the solder or other molten metal, the molten metal or solder is forced through the spaces between the tabs into the walls of the orifices to form reliable conductive passage-ways between the conductive paths on the opposite sides of the base plate. In the embodiment of Fig. 6, the conductive paths 2 carried by the base plate 1 are shown connected with the conductive paths 2 on the wafer element 3 by the solder 16. It is to be noted that the solder effects a continuous and reliable conductive passage-way between the conductive paths on the opposite sides of the base plate.

While there has been hereinbefore described what are at present considered preferred embodiments of the invention, it will be apparent that many and various changes and modifications may be made with respect to the embodiments illustrated, without departing from the spirit of the invention. It will be understood, therefore, that all such changes and modifications as fall fairly within the scope of the present invention, as defined in the appended claims, are to be considered as a part of the present invention.

What is claimed is:

1. A wafer element for supporting an electrical component, adapted to be secured in a position perpendicular to a mounting surface, comprising a flat plate of insulating material; a plurality of rectangular shoulders extending from an edge of said plate defining, with said edge, rectangular indentations between said shoulders; a rectangular tab extending from the outer edge of each of said shoulders and being of lesser width than its respective shoulder for projecting into orifices in said mounting surface whereby said indentations provide rectangular openings between said mounting surface and said wafer element when said wafer element is mounted with said tabs disposed in said orifices; conductive material disposed on the opposite sides of each of said tabs; paths of conductive material disposed on surfaces of said wafer element and connected with the conductive material of selected tabs; and an electrical component carried by said wafer element and connected to its conductive paths.

2. A wafer element for supporting an electrical component adapted to be secured in a position perpendicular to a mounting surface, comprising a flat plate of insulating material; a plurality of rectangular shoulders extending from an edge of said plate defining, with said edge, rectangular indentations between said shoulders; a rectangular tab extending from the outer edge of each of said shoulders and being of lesser width than its respective shoulder for projecting into circular orifices in said mounting surface whereby conductive adhesive material may readily pass through said orifices to establish a rigid jointure between said wafer element and said surface, said indentations providing rectangular openings between said mounting surface and said wafer element when said wafer element is mounted with said tabs disposed in said orifices and providing thereby maximum insulation between adjacent tabs; conductive material disposed on the opposite sides of each of said tabs; paths of conductive material disposed on surfaces of said wafer element and connected with the conductive material of selected tabs; and an electrical component carried by said wafer element and connected to its conductive paths.

References Cited in the file of this patent

UNITED STATES PATENTS

| | | |
|---|---|---|
| 2,226,745 | Schrack | Dec. 31, 1940 |
| 2,244,009 | Hiensch et al. | June 3, 1940 |
| 2,468,785 | Sealey | May 3, 1949 |

OTHER REFERENCES

Swigget, R. I.: Modern Plastics, August 1951, p. 107.

Centralab, Tele-Tech, November 1953, p. 47.